April 9, 1957
A. HAR'EL
2,788,398
PHASE CONVERTER CIRCUIT
Filed Aug. 27, 1954
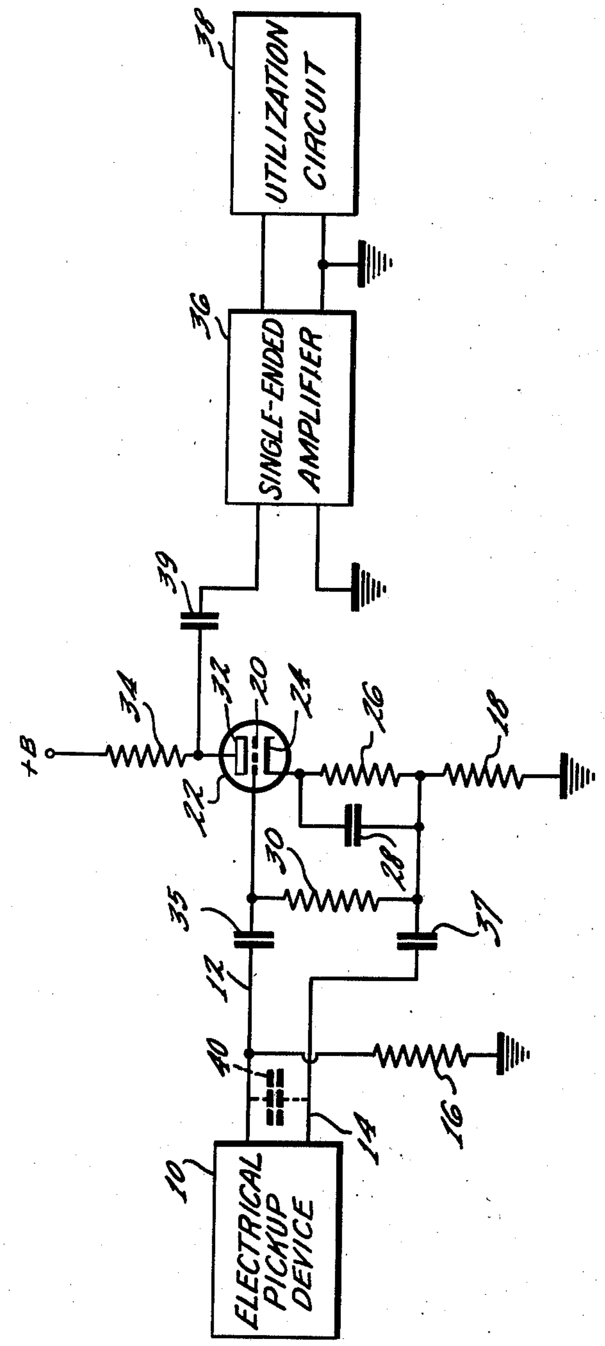
INVENTOR,
Abraham Har'el
BY H. L. Newton
ATTORNEY.

United States Patent Office 2,788,398
Patented Apr. 9, 1957

2,788,398

PHASE CONVERTER CIRCUIT

Abraham Har'el, Camden, N. J., assignor to Radio Corporation of America, a corporation of Delaware Application August 27, 1954, Serial No. 452,679

2 Claims. (Cl. 179—171)

This invention relates to phase converter circuits, and more particularly to a single tube phase converter amplifier having a high input impedance for converting balanced or push-pull signals to single-ended signals.

In many applications in which electrical signal voltages must be picked up by an electrical pickup device it is advisable to use a balanced or push-pull output from the pickup device in order to eliminate, in so far as possible, much of the noise that will be picked up by the device itself or by the leads from the device to an amplifier. This is especially true where a shielded lead cannot be used because of the high capacitance of this type of lead, and ordinary conductor wires must be connected to the pickup device. A balanced signal of the type mentioned above would appear between two leads and a ground for the system. As the signal is going positive on one lead, for instance, with respect to ground it is going negative with respect to ground on the other lead. Any noise picked up by the leads will be of the same polarity on both leads at the same instant of time and will thus be cancelled out if the balanced signal is properly applied to an amplifier tube. Even though it is advantageous to have a balanced pickup for such signals, it is more economical and much more feasible to do the bulk of the voltage amplification of the signal with a single-ended amplifier. The balanced signal, therefore, must be converted to a single-ended signal; and, if the pickup device has a high output impedance, it is desirable that the converter have a high input impedance.

Accordingly, it is one of the objects of this invention to provide a conversion stage for a signal translating channel having a high impedance input circuit to convert balanced or push-pull electrical signals to single-ended signals.

It is another object of this invention to provide a phase converter amplifier having a high impedance balanced or push-pull input circuit and a single-ended output circuit.

It is yet another object of this invention to provide a phase converter amplifier having a high impedance input circuit to convert balanced or push-pull signals to single-ended signals.

These and further objects and advantages of the present invention are achieved, in general, by providing a vacuum tube amplifier wherein one side of a balanced or push-pull signal is applied between the control grid of the amplifier tube and ground, and the other signal of the balanced pair is applied between the cathode of the tube and ground across a large cathode resistor. The input impedance presented to the signal applied to the cathode circuit is large and the impedance of the grid circuit is made substantial equal to it. To achieve this high impedance, balanced input circuit it is necessary to use extremely large anode and cathode resistors so that the tube will operate at the proper point on its characteristics. A single-ended output signal is then taken from the anode of the tube.

However, the invention itself, both as to its organization and operation, will be best understood from the following description when read in connection with the accompanying drawing, which is a schematic diagram of an electric signal translating channel having a phase converter circuit embodying the present invention.

Referring now to the sole figure of the drawing, an electrical pickup device 10 applies signals through leads 12 and 14 to a phase converter tube 22. One signal of the balanced pair is developed across a grid signal resistor 16 and applied to a grid 20 of the tube 22, and the other signal of the balanced pair is developed across a cathode input circuit including a cathode signal resistor 18 and applied to the cathode 24 of the tube 22 through a bias resistor 26 and a by-pass capacitor 28. The bias resistor 26 and the by-pass capacitor 28 provide the D.-C. operating bias voltage for the tube 22 which bias voltage is returned by a large grid resistor 30 to the grid 20. The anode 32 of the tube 22 is connected to a source of operating potential +B through a large anode load resistor 34. D.-C. blocking capacitors 35 and 37 are provided in the input leads 12 and 14.

The balanced signal applied by leads 12 and 14 to the tube 22 is amplified and converted to a single-ended signal, as will be more fully explained hereinafter, and applied through a coupling capacitor 39 to a single-ended amplifier 36 and further amplified. Finally the signals are connected to any utilization circuit 38 that may be desired.

The electrical pickup device 10 and the leads 12 and 14 together form a balanced signal circuit, and the grid and cathode input circuits of the tube 22 provide a balanced or push-pull signal input circuit for the phase converter tube 22.

Referring again to the tube 22 it will be seen that the signal appearing on lead 12 will be developed between the grid 20 of the tube 22 and a reference potential or ground for the amplifier across the grid signal resistor 16. The grid 20 will not draw current, therefore, the impedance presented to the signals appearing on lead 12 will be merely the impedance of grid signal resistor 16.

On the other hand, the impedance presented to the signal appearing on lead 14 will be different from the value of the cathode signal resistor 18 inasmuch as there is tube space current flowing through this resistor. By well known circuit principles the impedance presented to signals appearing on lead 14 will be the reciprocal of the cathode input admittance, and this cathode input admittance, that is the admittance presented to a signal present across the cathode signal resistor 18, is given by the following formula:

$$g_{in}=\frac{1}{R_k}+\frac{\mu+1}{R_1+r_p} \qquad (1)$$

where $g_{in}$ is the cathode input admittance, $R_k$ is the cathode signal resistor 18, $\mu$ is the amplification factor of the tube 22, $R_1$ is the anode load resistor 34, and $r_p$ is the plate resistance of the tube 22.

From the Formula 1 it can be seen that by using a very high impedance anode resistor 34 on the order of megohms and high impedance cathode signal resistor 18 on the order of tenths of megohms that a very low cathode input admittance can be realized; and since, as stated before, the cathode input impedance is the reciprocal of the input admittance, a low input admittance indicates a very high input impedance. In this manner, for example, $$\frac{1}{g_{in}}$$

can easily be made equal to 100,000 ohms, whereas if the tube were operated in the conventional manner the $$\frac{1}{g_{in}}$$

is approximately the reciprocal of the transconductance of the tube which is on the order of 500 ohms.

To provide, then, a high impedance balanced load to the eelctrical pickup device the value of resistor 16 is made equal to $$\frac{1}{g_{in}}$$

As an example, if the cathode signal resistor 18 is 220,000 ohms, the anode load resistor 24 is 3,900,000 ohms, the bias resistor 26 is 27,000 ohms, the grid resistor 30 is 3,300,000 ohms, the B+ value is 175 volts and the $\mu$ of the tube 22 (a 6J5) is 20, then the cathode input impedance $$\frac{1}{g_{in}}$$

will be about 100,000 ohms. This grid signal resistor 16 is then made equal to 100,000 ohms so that the input circuit will be balanced. The single-ended output impedance of the amplifier will be on the order of 500,000 ohms.

The balanced signal input circuit allows the use of an ordinary two wire leadin, as indicated by leads 12 and 14, resulting in low shunting capacitance indicated by the dotted capacitor 40.

The circuit operates in the following manner: As the voltage on the lead 12 and the grid 20 (since it is tied directly to lead 12) increases in a positive direction with respect to ground potential a larger voltage will be developed between the grid 20 and the cathode 24 resulting in an increase in tube current. At the same time the signal on lead 14 will be decreasing since the circuit is balanced. This decreases the voltage on the cathode 24, since the bypass condenser 28 is essentially a short circuit to signal frequencies, making the grid 20 again more positive with respect to the cathode 24 again causing an increase in tube current. Since both a rise in voltage on lead 12 and a decrease in voltage on lead 14 cause an increase in the current through the tube 22 the two signals have thus been combined to produce a composite signal to the tube and one output may thus be obtained without losing the benefit of one of the pair of balanced signals. The output is taken from the anode 32 of the tube 22 across the large anode output resistor 34 and applied to any further stages of single-ended amplification that are desired.

It will be noted that the values of the cathode resistor 18 and the anode resistor 34 must be extremely high to secure this operation. Only a very few microamperes of current will flow when the tube is operated in this manner, but a large voltage amplification will be obtained. The voltage amplification (A) of each input is determined by this formula:

$$A=\frac{\mu-\frac{r_p}{R_1}}{1+\frac{r_p}{R_1}} \qquad (2)$$

If this equation be solved for the amplification (A) using the values as before it will be seen that the amplification almost reaches the value of $\mu$, the theoretical maximum amplification of the tube.

In the figure, the phase converter amplifier is shown as R–C couple, but, as is well known, if a proper type of bias circuit is used the amplifier may be direct-coupled.

The phase converter amplifier circuit of the present invention can be used with either a low impedance or a high impedance electrical pickup device, and it is especially useful in matching a high impedance pickup device to its load circuit.

If the phase converter tube 22 is biased so that it would operate on the proper non-linear portion of its operating characteristics it can be made to act as a signal mixer, and the ordinary heterodyne components would appear in the output circuit if two signals of different frequencies were applied to the grid and cathode input circuits. The converter also is capable of being used as a phase detector. If two signals of the same frequency but of different phase are applied to the grid and cathode circuits, respectively, the output will be proportional to the sine of half the angular phase difference between signals.

A phase converter amplifier in accordance with the present invention provides a balanced high impedance input to convert a balanced or push-pull signal to a single-ended signal, and at the same time provides a substantial amount of voltage amplification. The device is characterized by its simplicity of operation and inexpensive construction.

What is claimed is:

1. The combination with a signal conveying circuit for balanced signals and a single-ended amplifier, of a phase converter and coupling circuit therefor, comprising an amplifier tube having a cathode, an anode, and a control grid, a high impedance grid signal resistor having a resistance value less than one megohm connected between said grid and ground for said circuit, a bias resistor and a high impedance cathode signal resistor serially connected between the cathode and said ground, said cathode resistor having a value less than one megohm and said bias resistor being connected adjacent said cathode and having a by-pass capacitor connected in shunt therewith, said signal conveying circuit being connected between the junction of said resistors and the grid of the tube, a grid resistor connected between the control grid and the junction of said serially connected resistors, and a high impedance load resistor having a resistance value of the order of several megohms connected between said anode and a source of D.-C. operating potential for said amplifier whereby said balanced signals are converted to a single-ended signal with a large voltage amplification of the signal.

2. A phase converter circuit for converting balanced input signals to single-ended output signals comprising, an amplifier tube having a cathode, an anode, and a control grid, a high impedance grid signal resistor connected between said grid and a ground for said circuit, a serially connected bias resistor and a high impedance cathode signal resistor connected between said cathode and said ground, said bias resistor being connected adjacent said cathode and having a by-pass capacitor connected in shunt therewith, means providing a balanced signal circuit connected between said grid and the junction of said bias resistor and said high impedance cathode signal resistor, and means providing a grid return resistor connected between said grid and the junction of the said bias resistor and said high impedance cathode signal resistor, and a high impedance load resistor connected between said anode and a source of D.-C. operating potential for said amplifier.

References Cited in the file of this patent

UNITED STATES PATENTS

| | | |
|---|---|---|
| 2,256,084 | Goodale et al. | Sept. 16, 1941 |
| 2,296,920 | Goodale | Sept. 29, 1942 |
| 2,464,353 | Smith et al. | Mar. 15, 1949 |
| 2,483,410 | Grieg et al. | Oct. 4, 1949 |
| 2,485,948 | Williams et al. | Oct. 25, 1949 |